(12) United States Patent
Al-Nabulsi

(10) Patent No.: US 6,241,141 B1
(45) Date of Patent: Jun. 5, 2001

(54) REFLOW SOLDERING SELF-ALIGNING FIXTURE

(75) Inventor: Talal M. Al-Nabulsi, San Gabriel, CA (US)

(73) Assignee: Unitek, Monrovia, CA (US)

( * ) Notice: Subject to any disclaimer, the term of this patent is extended or adjusted under 35 U.S.C. 154(b) by 0 days.

(21) Appl. No.: 09/533,410

(22) Filed: Mar. 22, 2000

Related U.S. Application Data

(62) Division of application No. 08/710,784, filed on Sep. 20, 1996, now Pat. No. 6,047,875
(60) Provisional application No. 60/004,001, filed on Sep. 20, 1995.

(51) Int. Cl.$^7$ .............................. B23K 37/04; B23Q 1/25
(52) U.S. Cl. ...................... 228/5.5; 228/49.5; 269/67; 269/68; 269/69; 269/902; 269/903
(58) Field of Search .................... 269/67, 68, 69, 269/310, 902, 903; 228/106, 212, 213, 5.5, 6.2, 8, 9, 10, 12, 44.7, 49.1, 49.5

(56) References Cited

U.S. PATENT DOCUMENTS

| | | | |
|---|---|---|---|
| 3,574,923 | 4/1971 | Cushman | 29/471.1 |
| 3,595,556 * | 7/1971 | Schonauer | 269/71 |
| 3,762,060 * | 10/1973 | Hardy | 269/71 |
| 3,764,126 * | 10/1973 | Arenas | 269/71 |
| 3,774,834 | 11/1973 | Holler et al. | 228/3 |
| 3,783,225 * | 1/1974 | Filsinger | 269/71 |
| 3,988,014 * | 10/1976 | Worden | 269/71 |
| 4,638,937 | 1/1987 | Belanger, Jr. | 228/5.5 |
| 4,879,809 * | 11/1989 | Nicholas et al. | 29/860 |
| 4,896,811 | 1/1990 | Dunn et al. | 228/5.5 |
| 5,092,510 * | 3/1992 | Anstrom et al. | 228/55 |
| 5,127,573 | 7/1992 | Chang et al. | 228/180.2 |
| 5,176,312 * | 1/1993 | Lowenthal | 228/180.1 |
| 5,377,897 * | 1/1995 | Zimmer | 228/106 |
| 5,617,622 * | 4/1997 | Anderson | 29/281.3 |
| 5,637,024 * | 6/1997 | Goda | 228/212 |
| 5,730,630 * | 3/1998 | Lacourse et al. | 439/876 |
| 6,006,980 * | 12/1999 | Lacourse et al. | 228/180.21 |
| 6,105,241 * | 8/2000 | Ogle | 29/760 |

OTHER PUBLICATIONS

Hughes Technology Products Division brochure entitled "Hughes Model HTT–SLT–2000 PCMCIA Station", 1994.

\* cited by examiner

*Primary Examiner*—Patrick Ryan
*Assistant Examiner*—Kiley Stoner
(74) *Attorney, Agent, or Firm*—Christie, Parker & Hale, LLP

(57) ABSTRACT

An improvement in a reflow soldering apparatus for bonding a connector element such as flexible circuitry or a pin type input/output (I/O) connector to a printed circuit board (PCB) is disclosed wherein a fixture tray included in the apparatus automatically aligns or self levels itself with the heating bars, or thermodes, of the apparatus. The fixture tray includes a body for supporting the connector/PCB assembly and cylindrical rods extending from the body. The rods are rotatably supported in corresponding grooves on the surface of the fixture tray table. As a thermode is pressed onto the connector/PCB assembly, the fixture tray rotates about its axis of rotation until the work area is aligned with the thermode. In a sandwich type soldering application including a pair of thermodes for simultaneously soldering opposite sides of a connector/PCB assembly, the fixture tray rests on an upper plate of a tray table supported by resilient means such as springs. Pressing an upper thermode onto the upper work surface of the connector/PCB assembly causes the work surface to rotate into alignment with the thermodes, and further causes the upper plate to descend until the bottom work surface of the connector/PCB assembly contacts the lower thermode prior to initiation of a reflow soldering cycle.

18 Claims, 6 Drawing Sheets

REFLOW SOLDERING SELF-ALIGNING FIXTURE

CROSS-REFERENCE TO RELATED APPLICATION

This patent application is a divisional patent application of U.S. patent application Ser. No. 08/710,784, filed Sep. 20, 1996, now U.S. Pat. No. 6,047,875 that claims the benefit of provisional patent application Serial No. 60/004,001, filed Sep. 20, 1995.

FIELD OF THE INVENTION

The present invention relates generally to tool fixtures and soldering systems, and more particularly to a self-leveling, self-aligning fixture for precision reflow soldering applications.

BACKGROUND

There are many reflow soldering applications that require precise alignment and coplanarity between components for proper electrical and mechanical bonding. One of the final steps in the production of a printed circuit board (PCB) such as a PCMCIA card, for example, is the reflow soldering of the PCB to an input/output connector (I/O connector). A typical I/O connector may be single or double-sided and has a plurality of fragile leads or pins, each of which corresponds to a respective connector trace at the edge of a PCB card. To reflow solder these components together, a small amount of flux is placed on the connector traces on the PCB to form solder pads. The I/O connector is then placed or slipped on the end of the PCB to form a temporary connector/PCB assembly and the two components are then reflow soldered to create a finished assembly.

Reflow soldering of connector/PCB assemblies has been accomplished by many different methods. One common method for double-sided connectors involves sandwiching the assembly between two hot bars, or thermodes, using pressure and heat to reflow solder the leads to the PCB. Alignment of the pins on the I/O connector with the corresponding solder pads on the PCB and coplanarity between the I/O connector and PCB are critical to ensure good mechanical and electrical coupling at every connector trace and compliance with industry standard specifications. The specifications for personal computers, laptops and other electronic products, for example, require that the edges of the connector and PCB be parallel and within a certain distance of one another in order for the assembly to be mechanically packaged in the final product.

Such specifications, however, are sometimes difficult to achieve because PCBs often become warped by heat and mechanical forces the board experiences during processing. This creates problems during reflow soldering since warpage of the board can prevent proper alignment of the thermode contact surface with the connector/PCB assembly. Misalignment can result in an uneven pressure profile at the surface to be soldered, or work surface, creating either too much pressure at some soldering sites and/or too little pressure at other sites. If the pressure exerted by the thermodes is too large, the leads may be squeezed toward each other and solder may flow over multiple leads, causing a short circuit. Conversely, if the pressure is too small in certain areas, the resulting bonds may be too weak, resulting in an open circuit or even mechanical failure.

One solution known in the art to prevent misalignment of the connector/PCB assembly with the thermodes has been to place a pivot at the top of the thermode head. However, undesirable skidding can occur in this arrangement if one edge of the thermode contacting surface initially contacts the work area between two I/O connector pins, consequently engaging a lead and pushing the connector out of alignment with the PCB during its rotation. Such skidding can cause damage to the connector leads, misalignment problems including offset between the leads and corresponding connector traces, and movement of the connector out of the plane of the PCB.

Another solution aimed at addressing these skidding problems has been to provide thermodes connected to two leaf spring flexures, usually thin blades of stainless steel. In this thermode head, the thermode pivots around a point at the center of the contact surface of the thermode. While this may reduce skidding, such devices are somewhat complicated and expensive to manufacture. In addition, the resilience of the material used in the leaf spring flexures can be affected by heat during the reflow cycle, which over time can reduce the reliability and repeatability of the reflow soldering process.

In view of the deficiencies in the known processes, those skilled in the art would desire an improved system for reflow soldering electrical components, which can accommodate for any misalignment or non-coplanarity between the connector and connector/PCB assembly and allow for leveling of the heating element without skidding.

SUMMARY OF THE INVENTION

The present invention provides a novel self-aligning fixture having a fixture tray and table for reflow soldering electrical components such as a printed circuit board (PCB) and a corresponding input/output (I/O) connector. A connector/PCB assembly is placed on a fixture tray in the self-aligning fixture which rotates into place to correctly align the work surface of the connector/PCB assembly with the thermode contacting surface prior to reflow soldering. The fixture tray includes a body and first and second cylindrical rods extending from opposite sides of the body. The fixture tray is removably mounted in an upper plate of a tray table having a window adapted to rotatably support the tray and first and second grooves adapted to accommodate the fixture tray rods. The rods allow the fixture tray to self-level and rotate into alignment when the thermode contacting surface is pressed onto the connector/PCB assembly.

In the case of applications requiring simultaneous reflow soldering of opposite sides of a component such as a double-sided I/O connector to a PCB, bearing shafts are attached to the upper plate of the tray table and are resiliently mounted in corresponding shaft housings extending through a lower plate of the table. This allows vertical motion of the upper plate with respect to the lower plate and provides clearance for the fixture tray to rotate and self-level with the upper thermode contacting surface prior to contact between the bottom work surface of the connector/PCB assembly with the lower thermode contacting surface.

In operation, as the upper thermode is lowered and contacts the top work surface on the connector/PCB assembly, the fixture tray rotates to bring the work surface into full contact with the thermode contacting surface. The upper thermode continues to press into the assembly, pressing the upper plate of the tray table downward until the bottom work surface of the connector/PCB assembly makes contact with the lower thermode contacting surface and the proper pressure between the connector/PCB assembly and the thermodes is attained. The thermodes are then heated and the PCB is reflow soldered to the connector.

BRIEF DESCRIPTION OF THE DRAWINGS

These and other features of the invention will become apparent in the following detailed description of a presently preferred embodiment taken in conjunction with the accompanying drawings, wherein.

DETAILED DESCRIPTION

Figure 1A:
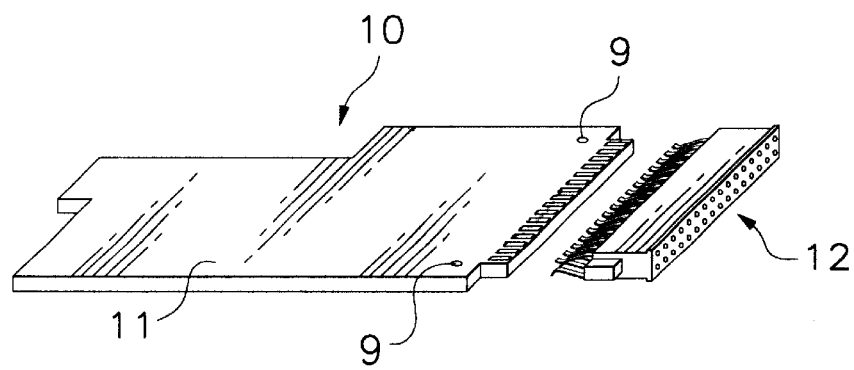
FIG. 1A is a perspective view of an exemplary input/output connector and printed circuit board.
Figure 1B:
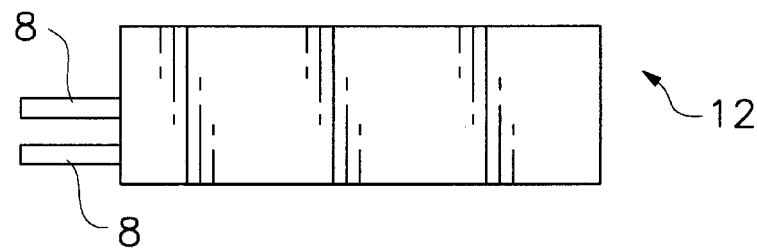
FIG. 1B is a side view of the input/output connector.
Figure 1C:
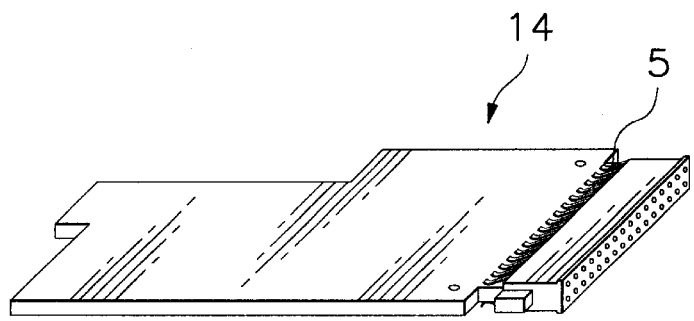
FIG. 1C is a perspective view of the connector/PCB assembly.
Figure 1D:
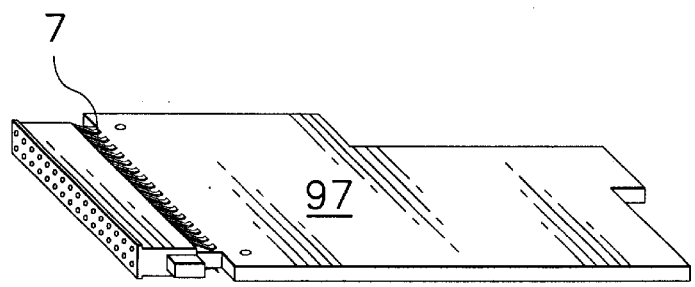
FIG. 1D is another perspective view of the connector/PCB assembly.

Referring to FIG. 1A, a preferred embodiment of a reflow soldering self-aligning fixture according to the invention is used to reflow solder electrical components such as a PCMCIA printed circuit board (PCB) 10 with substrate 11 to a standard 68-pin double-sided input/output connector (I/O connector) 12. The I/O connector 12 has two rows of pins 8 (FIG. 1B) which correspond to previously fluxed connector traces on the top and bottom of the PCB. The connector/PCB assembly 14, shown in FIG. 1C and FIG. 1D, is formed by slipping the PCB into the space between the two rows of connector pins. The surfaces to be soldered are located at the junction between the I/O connector and the PCB and include a top work surface 5 and a bottom work surface 7.

Figure 2:
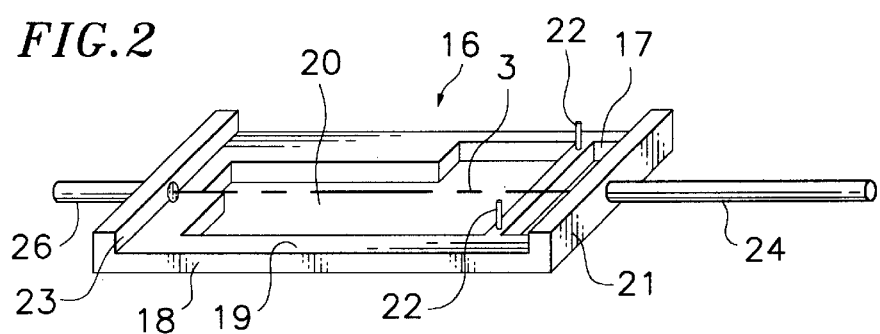
FIG. 2 is a perspective view of the fixture tray.

The connector/PCB assembly is then placed on the fixture tray 16 shown in FIG. 2. The tray includes a body 18 including a component assembly supporting surface 19 and front and rear raised walls 21, 23 and an axis of rotation 3. In the presently preferred embodiment, the assembly supporting surface 19 is a substantially flat plate having custom designed apertures 17, 20 designed to support the I/O connector and the PCB. Locating pins 22 (shown exaggerated in FIG. 2) provided on the tray body 18 fit into corresponding locating holes 9 (FIG. 1A) on the PCB to ensure proper alignment of the connector/PCB assembly on the tray. The fixture plate can be designed in numerous ways to accommodate different types of electrical components and assemblies for a wide range of applications.

Figure 3:
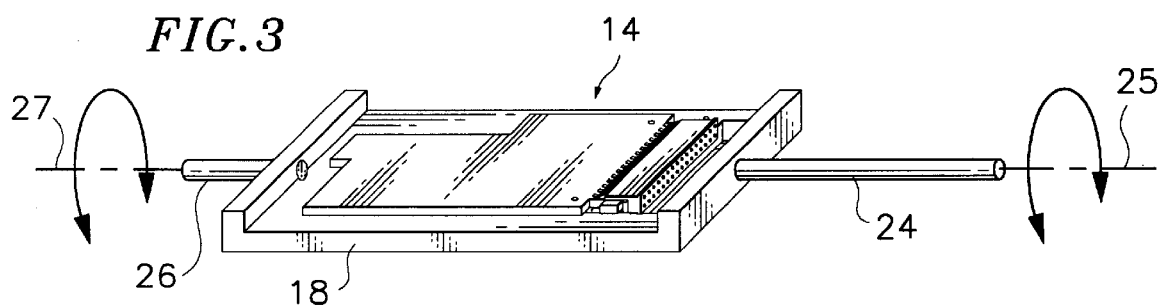
FIG. 3 is a perspective view of the printed circuit board assembly placed in the fixture tray.
Figure 10:
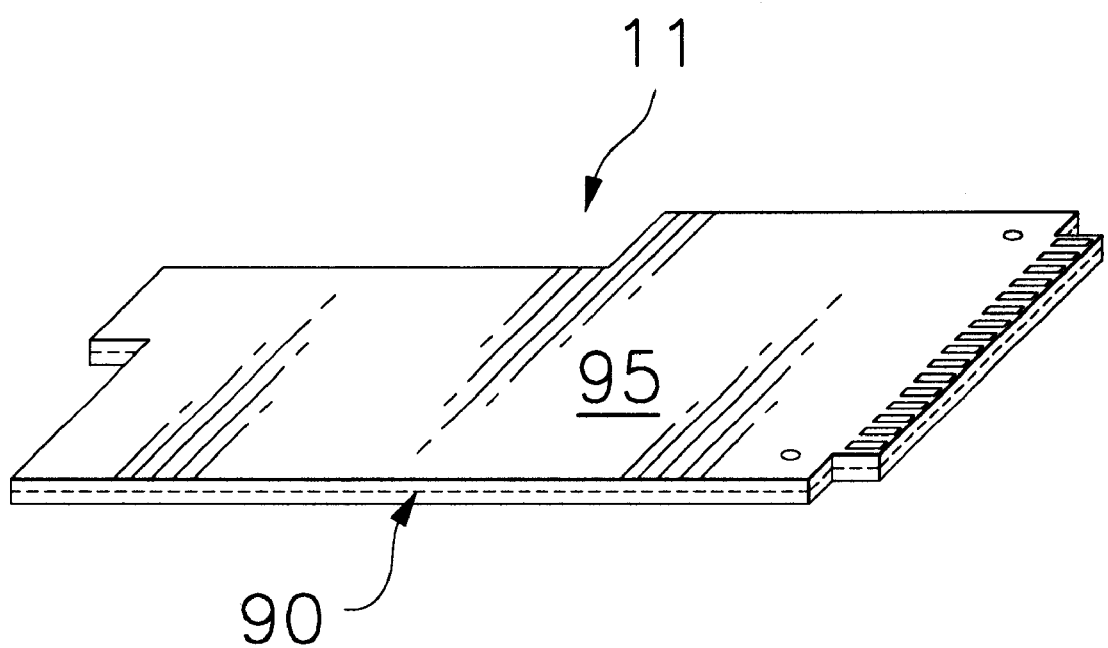
FIG. 10 is a perspective view of the printed circuit board which illustrates the center plane of the board.

Referring to FIG. 2 and FIG. 3, the fixture tray further includes a front rod 24 and rear rod 26 extending from the respective walls of the tray body. In a preferred embodiment of the fixture, the axial centers 25, 27 of the rods are aligned with the axis of rotation 3 of the tray and are located above the assembly supporting surface substantially in the PCB substrate center plane 90 (FIG. 10). The center plane is located equidistant between the planes of the top surface 95 and bottom surface 97 of the PCB substrate.

Figure 4:
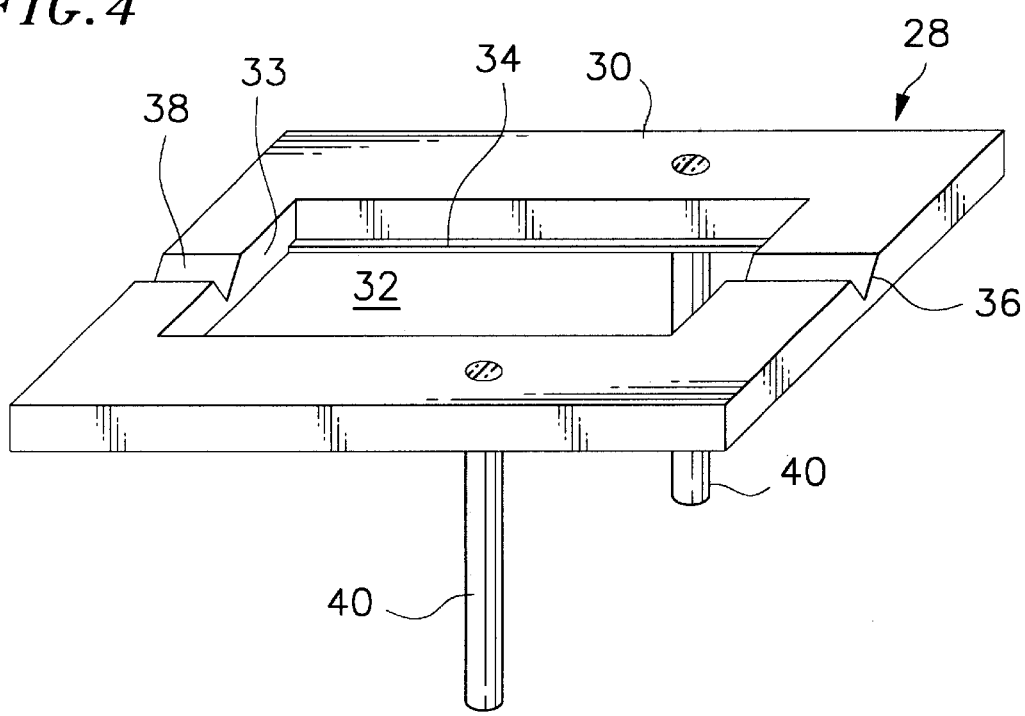
FIG. 4 is a perspective view of the upper plate of the fixture tray table.
Figure 5:
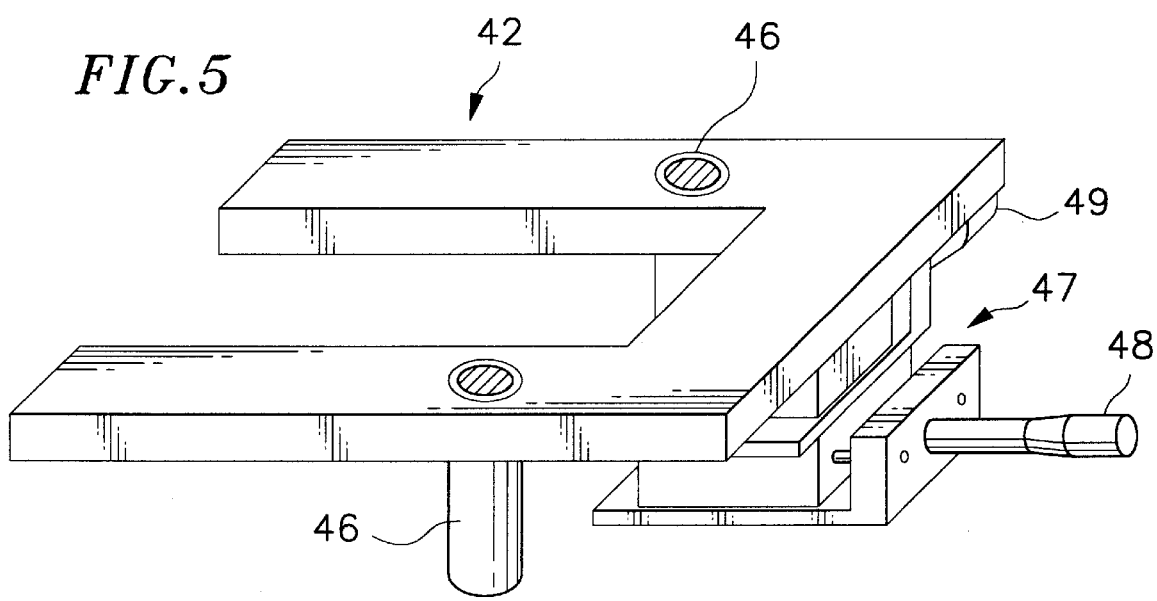
FIG. 5 is a perspective view of the lower plate of the fixture tray table.
Figure 8:
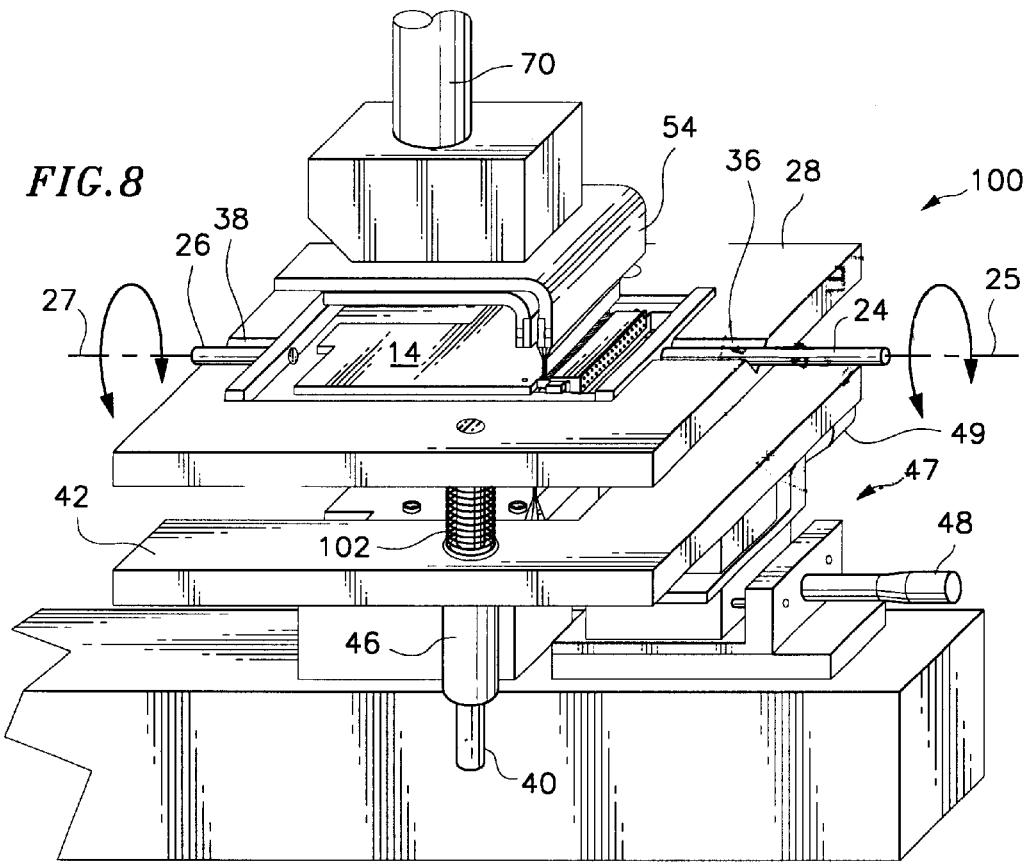
FIG. 8 is a perspective view of the self-aligning fixture assembly.

The fixture tray is removably and rotatably mounted on a table including a rectangular upper plate 28 (FIG. 4) and U-shaped lower plate 42 (FIG. 5). As shown in FIG. 8, the fixture tray is mounted to the table by placing the tray in the window 32 and the front and rear rods 24, 26 in corresponding V-shaped grooves 36, 38 provided on the upper (top) surface 30 of the upper plate. In a preferred embodiment, the tray is designed to sit in the window 32 of the upper plate with the rods resting in the grooves, thereby allowing the tray to pivot around the center of the two rods.

Figure 6:
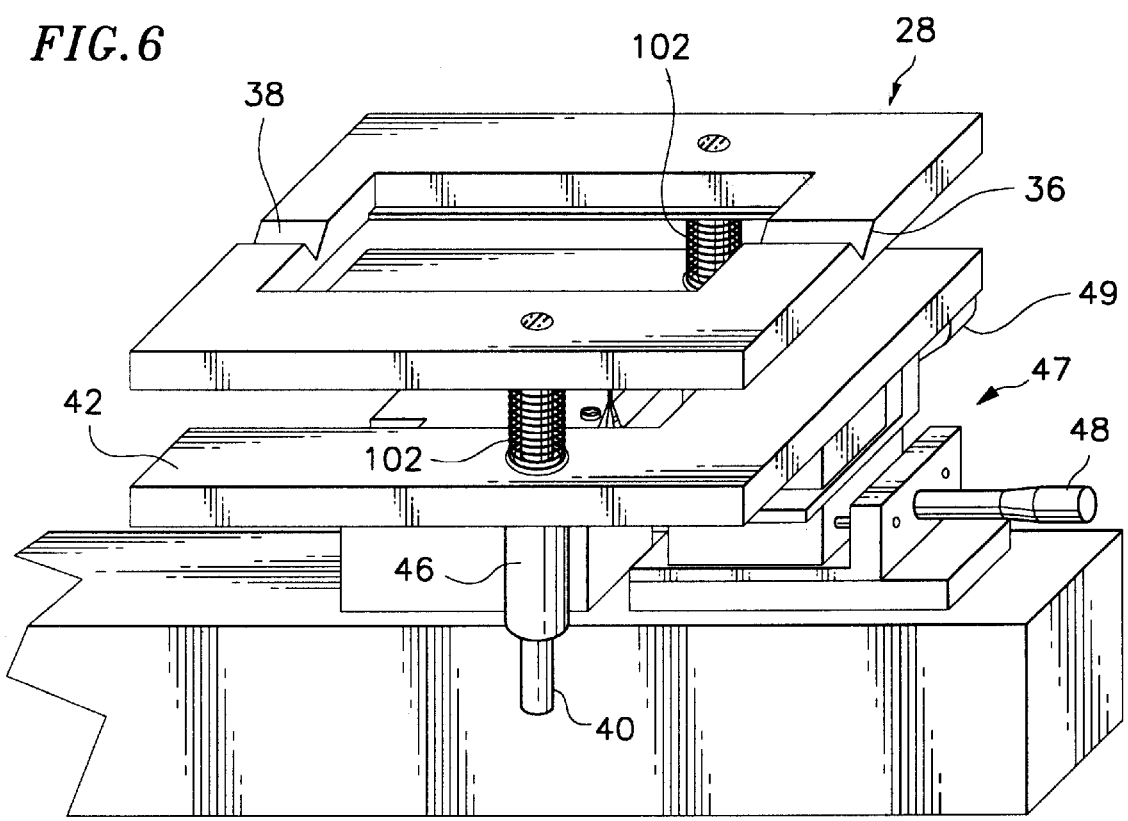
FIG. 6 is a perspective view of a fixture tray table.

For mounting the upper plate on the lower plate, the upper plate further includes a pair of bearing shafts 40. The bearing shafts 40 slide into bearing housings 46 extending through the lower plate. As shown in FIG. 6, helical return springs 102 are placed on the bearing shafts to resiliently suspend the upper plate over the lower plate and to allow the upper plate to move relative to the lower plate.

Figure 7:
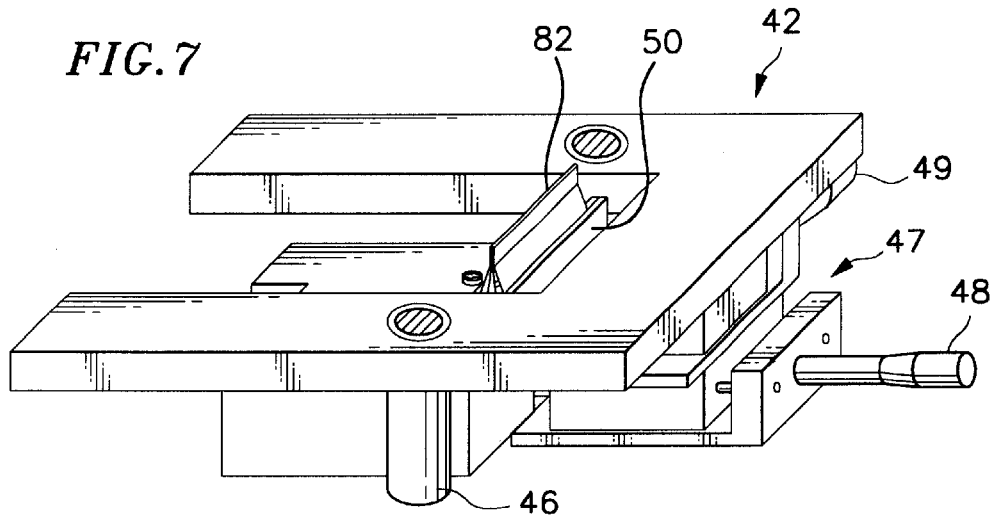
FIG. 7 is a perspective view of the lower plate of the fixture tray and the lower thermode.
Figure 9:
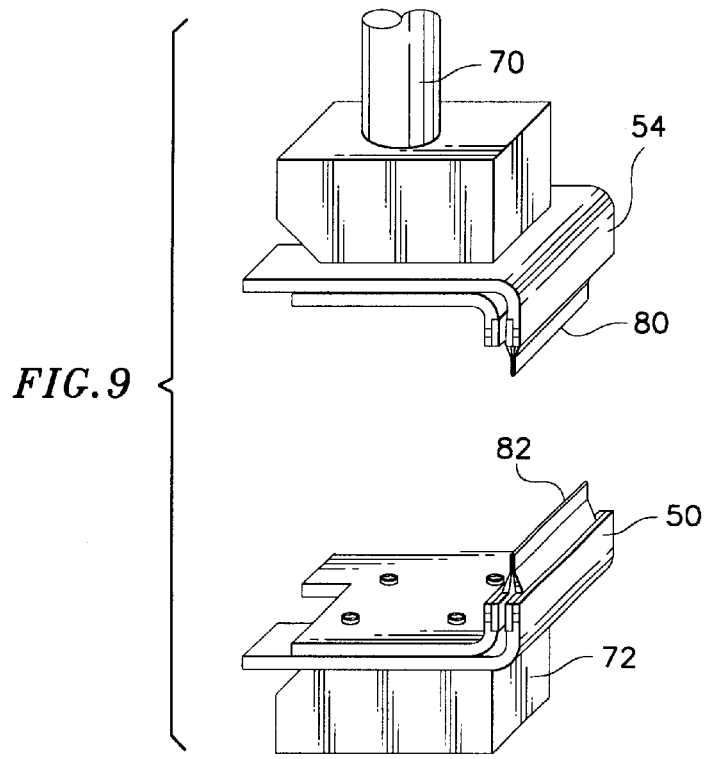
FIG. 9 is a perspective view of the upper and lower thermodes.

A conventional sandwich type reflow soldering system includes upper and lower thermodes 50 and 54 attached to upper and lower reflow soldering heads 70 and 72 (FIGS. 8–9). For use with the self-aligning fixture according to the present invention, the lower thermode 50 is positioned within a recess in the lower plate 42, as shown in FIG. 7. The lower plate can be adjustably positioned along the X and Y-axes by means of a positioning slide assembly 47 having substantially similar micrometer adjustment knobs for the X-axis 48 and the Y-axis 49. As shown in FIG. 8, the upper thermode 54 is attached to an adjustable thermode press (not shown) for Z-axis movement relative to the connector/PCB assembly. A suitable reflow soldering system adapted for use with the present invention is disclosed in applicant's provisional patent application Serial No. 60/004,001, filed Sep. 20, 1995, the contents of which are hereby incorporated by reference.

In operation, reflow soldering a PCB to an I/O connector is accomplished by first placing the connector/PCB assembly 14 on the fixture tray body 18 using the locating pins 22 to correctly align the connector/PCB assembly. The fixture tray 16 is then placed upon and positioned in the upper plate 28 of the fixture table 100 such that the front end 21 of the fixture tray body is flush with the front wall (not shown) of the window. In one embodiment, this is accomplished by providing push pins or any other suitable biasing mechanism positioned adjacent the rear wall 33 of the window to press or bias the fixture tray into the front wall of the window.

Prior to the initial use of the invention with a particular connector/PCB assembly, the contact surface 82 of lower thermode is aligned with the bottom work surface of the connector/PCB assembly by using the micrometer adjustments 48, 49 on the X-Y axes positioning slide assembly 47. Then, the contacting surface 80 of the upper thermode 54 is aligned directly over the contacting surface 82 of the lower thermode, as shown in FIG. 9.

After the initial set up, the upper thermode is lowered until it makes contact with the top surface of the connector/PCB assembly. The downward motion of the thermode presses the thermode contacting surface onto the top work surface 15 of the connector/PCB assembly which causes the fixture tray to rotate or pivot about its axis of rotation, thereby aligning the top work surface of the connector/PCB assembly with the upper thermode contacting surface. As the upper thermode continues its downward motion causing the return springs 102 to compress, the upper assembly, tray and plate descend until the lower thermode contacting surface contacts the bottom of the connector/PCB junction. The thermode press continues to force the upper thermode down until a conventional sensing mechanism in the fixture detects a preset pressure between the thermodes and the connector/PCB junction. When the movement stops upon reaching a desired pressure, heat is applied to reflow solder the connector leads to the PCB to produce a finished assembly.

As will be appreciated by those skilled in the art, the self-aligning fixture according to the present invention ensures flatness through self-leveling between the connector/PCB assembly and thermode contacting surfaces. In addition, it ensures repeatability of the final position of the connector. This is accomplished by making the connector/PCB assembly align to the thermode contacting surfaces.

While a preferred embodiment of the invention has been illustrated and described, it should be understood that variations will be apparent to those skilled in the art. Any suitable means may be used, for example, to rotatably mount the fixture tray to the table, such as a ball and socket assembly, bearings, or other suitable joint. Similarly, any suitable means may be used to resiliently mount the upper table to the lower table. In some applications, a separate upper and lower table may not be necessary. In addition to PCMCIA applications, the invention could be used to reflow solder a variety of different components such as, for example, circuit components or flexible cable to a PCB. The invention could also be modified for isotropic and anisotropic tack and bond processes, for applications requiring only one thermode, or for applications requiring more than one thermode at different sites on the same side of the PCB. Also, since the fixture tray of the invention is removable, the production throughput could be increased by loading connector/PCB assemblies into multiple fixture trays offline. Furthermore, additional structures can be utilize for pulsed heating and forced air cooling of the thermodes as is well known in the art. Accordingly, the invention is not to be limited to the specific embodiments illustrated and described, but should be determined by reference to the following claims.

What is claimed is:

1. A system for reflow soldering a printed circuit board assembly, the system comprising:
    a heating element including a contact surface for soldering components of the printed circuit board assembly;
    a tray comprising a body adapted to support and align components of the printed circuit board assembly substantially with the contact surface of the heating element, and first and second rods extending from opposite ends of the body, each of the rods having a center axis; and
    a tray table including pivot means for pivotally supporting the tray rods on to the table.

2. The system of claim 1 wherein the tray table comprises an upper surface and a window, said window for accommodating the tray body.

3. The system of claim 1 wherein the heating element comprises at least one movable thermode capable of being moved into contact with the printed circuit board assembly on the tray.

4. A system for coupling a first and second component comprising:
    a plurality of contact surfaces which press said first and second components together so as to operably couple said first and second components; and
    an alignment fixture, comprising a tray having first and second rotation members extending from opposite ends of the tray, wherein said alignment fixture is adapted to support and align said first and second components with said plurality of contact surfaces.

5. The system of claim 4 wherein at least one of said contact surfaces comprises a pulsed heat thermode.

6. The system of claim 5 wherein at least one of said contact surfaces is movable.

7. The system of claim 5 further comprising at least one reflow solder head, wherein said reflow solder head is coupled to one of said contact surfaces.

8. The system of claim 4 wherein at least one of said contact surfaces comprise a hot bar.

9. The system of claim 8 wherein at least one of said contact surfaces is movable.

10. The system of claim 4 wherein the first and second rotation members each have a center axis.

11. The system of claim 10 wherein said tray includes a support surface to support said first and second components.

12. The system of claim 10 wherein said alignment fixture further comprises a tray table adapted to pivotally support said first and second rotation members.

13. The system of claim 12 wherein said tray table comprises:
    an upper tray table including two or more bearing shafts; and
    a lower tray table, including two or more bearing housings, which operably engage said upper tray table bearing shafts for linearly mounting the upper tray table to the lower tray table.

14. The system of claim 13 wherein said upper tray table includes a plurality of indentations to operably engage said rotation members.

15. The system of claim 4 further comprising an alignment mechanism which aligns said alignment fixture and at least one of said plurality of contact surfaces.

16. The system of claim 4 further comprising an alignment mechanism that aligns said plurality of contact surfaces.

17. The system of claim 6 further comprising a thermode press that presses said movable thermode into contact with said first and second components.

18. The system of claim 17 further comprising a pressure sensor in electrical communication with said thermode press, which senses when a predetermined force between said movable thermode and said first and second components is reached.

* * * * *